United States Patent
Chien et al.

(10) Patent No.: US 6,894,930 B2
(45) Date of Patent: May 17, 2005

(54) DEEP WORDLINE TRENCH TO SHIELD CROSS COUPLING BETWEEN ADJACENT CELLS FOR SCALED NAND

(75) Inventors: Henry Chien, Manassas, VA (US); Yupin Fong, Fremont, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/175,764

(22) Filed: Jun. 19, 2002

(65) Prior Publication Data

US 2003/0235078 A1 Dec. 25, 2003

(51) Int. Cl.$^7$ .............................. G11C 16/00
(52) U.S. Cl. ..................... 365/185.17; 365/185.33
(58) Field of Search ................. 365/185.17, 185.33, 365/185.05, 185.06; 257/314, 315

(56) References Cited

U.S. PATENT DOCUMENTS

| | | | |
|---|---|---|---|
| 5,043,940 A | 8/1991 | Harari | 365/168 |
| 5,053,839 A | * 10/1991 | Esquivel et al. | 365/185 |
| 5,070,032 A | 12/1991 | Yuan et al. | 437/43 |
| 5,095,344 A | 3/1992 | Harari | 357/23.5 |
| 5,168,465 A | 12/1992 | Harari | 257/320 |
| 5,172,338 A | 12/1992 | Mehrotra et al. | 365/185 |
| 5,198,380 A | 3/1993 | Harai | 437/43 |
| 5,268,318 A | 12/1993 | Harari | 437/43 |
| 5,268,319 A | 12/1993 | Harari | 437/43 |
| 5,297,148 A | 3/1994 | Harari et al. | 714/720 |
| 5,313,421 A | 5/1994 | Guterman et al. | 365/185 |
| 5,315,541 A | 5/1994 | Harari et al. | 365/185.13 |
| 5,343,063 A | 8/1994 | Yuan et al. | 257/317 |
| 5,380,672 A | 1/1995 | Yuan et al. | 437/43 |
| 5,471,423 A | 11/1995 | Iwasa | 365/185.01 |
| 5,512,505 A | 4/1996 | Yuan et al. | 437/43 |
| 5,534,456 A | 7/1996 | Yuan et al. | 437/43 |

(Continued)

FOREIGN PATENT DOCUMENTS

KR  2002/0088554  11/2002

OTHER PUBLICATIONS

"Effects of Parasitic Capacitance on NAND Flash Memory Cell Operation," J–D Lee et al., *IEEE—Non–Volatile Semiconductor Memory Workshop*, Aug. 12–th–16$^{th}$, 2001, pp. 90–92.

(Continued)

*Primary Examiner*—Tan T. Nguyen
(74) *Attorney, Agent, or Firm*—Parsons Hsue & de Runtz LLP

(57) ABSTRACT

A NAND flash memory structure and method of making a flash memory structure with a wordline that provides shielding from Yupin effect errors and from disturbs.

32 Claims, 5 Drawing Sheets

U.S. PATENT DOCUMENTS

| | | | | |
|---|---|---|---|---|
| 5,554,553 | A | | 9/1996 | Harai .......................... 437/43 |
| 5,579,259 | A | | 11/1996 | Samachisa et al. ..... 365/185.14 |
| 5,595,924 | A | | 1/1997 | Yuan et al. ..................... 437/43 |
| 5,640,032 | A | | 6/1997 | Tomioka ..................... 257/316 |
| 5,654,217 | A | | 8/1997 | Yuan et al. ................. 438/588 |
| 5,661,053 | A | | 8/1997 | Yuan .......................... 437/43 |
| 5,677,872 | A | | 10/1997 | Samachisa et al. ..... 365/185.14 |
| 5,680,345 | A | * | 10/1997 | Hsu et al. .............. 365/185.01 |
| 5,712,179 | A | | 1/1998 | Yuan .......................... 437/43 |
| 5,712,180 | A | | 1/1998 | Guterman et al. .......... 438/263 |
| 5,747,359 | A | | 5/1998 | Yuan et al. ................. 437/186 |
| 5,751,038 | A | * | 5/1998 | Mukherjee ............. 365/185.05 |
| 5,756,385 | A | | 5/1998 | Yuan et al. ................. 438/258 |
| 5,786,988 | A | | 7/1998 | Harari ........................ 361/749 |
| 5,847,425 | A | | 12/1998 | Yuan et al. ................. 257/315 |
| 5,867,429 | A | | 2/1999 | Chen et al. ............. 365/185.33 |
| 5,883,409 | A | | 3/1999 | Guterman et al. .......... 257/316 |
| 5,965,913 | A | | 10/1999 | Yuan et al. ................. 257/321 |
| 5,999,448 | A | | 12/1999 | Kurihara et al. ....... 365/185.04 |
| 6,028,336 | A | | 2/2000 | Yuan .......................... 257/315 |
| 6,046,935 | A | | 4/2000 | Takeuchi et al. ........ 365/185.03 |
| 6,103,573 | A | | 8/2000 | Harari et al. ............... 438/257 |
| 6,151,248 | A | | 11/2000 | Harari et al. ........... 365/185.14 |
| 6,180,457 | B1 | | 1/2001 | Shin et al. .................. 438/258 |
| 6,208,545 | B1 | | 3/2001 | Leedy .......................... 365/51 |
| 6,222,762 | B1 | | 4/2001 | Guterman et al. ..... 365/185.03 |
| 6,235,586 | B1 | | 5/2001 | Au et al. ..................... 438/258 |
| 6,258,665 | B1 | | 7/2001 | Shimizu et al. ............. 438/257 |
| 6,281,075 | B1 | | 8/2001 | Yuan et al. ................. 438/257 |
| 6,295,227 | B1 | | 9/2001 | Sakui et al. ............ 365/185.17 |
| 6,391,717 | B1 | | 5/2002 | Shin et al. .................. 438/257 |
| 6,403,421 | B1 | | 6/2002 | Ikeda et al. ................. 438/267 |
| 6,417,538 | B1 | | 7/2002 | Choi .......................... 257/315 |
| 6,529,410 | B1 | | 3/2003 | Han et al. .............. 365/185.17 |
| 6,614,684 | B1 | | 9/2003 | Shukuri et al. ........ 365/185.05 |
| 6,624,464 | B2 | | 9/2003 | Shin et al. ................... 257/314 |
| 6,762,092 | B2 | | 7/2004 | Yuan et al. ................. 438/257 |
| 2002/0093073 | A1 | | 7/2002 | Mori et al. ................. 257/510 |

OTHER PUBLICATIONS

U.S. patent application Ser. No. 09/667,344, Yuan et al., filed Sep. 22, 2000.

U.S. patent application Ser. No. 09/925,102, Yuan et al., filed Aug. 8, 2001.

Y. Takeuchi et al., "A Self–Aligned STI Process Integration for Low Cost and Highly Reliable 1Gbit Flash Memories," *1998 Symposium on VLSI Technology—Digest of Technical Papers*, Jun. 9–11, 1998, pp. 102.

Seiichi Aritome, "Advanced Flash Memory Technology and Trends for File Storage Application," *2000 International Electron Devices Meeting*, Dec. 10–13, 2000, pp. 33.1.1–33.1.4.

European Patent Office, "International Search Report", corresponding PCT application No. PCT/US03/18183, Sep. 6, 2003, 4 pages.

Aritome et al., "A Novel Side–Wall Transfer–Transistor Cell (SWATT Cell) For Multi–Level NAND EEPROMs", 1995 IEEE International Solid–State Circuits Conference, IEDM 95, pp. 275–8.

Aritome et al., "A0.67um2 Self–Aligned Shallow Trench Isolation Cell (SA–STI CELL) for 3V–only 256Mbit NAND EEPROMs", IEDM Technical digest, pp. 61–64 (1994).

Cho et al., "A Dual–Mode NAND Flash Memory: 1–Gb Multilevel and High–Performance 512–Mb Single–Level Modes", IEEE Journal of Solid State Circuits, vol. 36, No. 11, pp. 1700–1706 (2001).

* cited by examiner

DEEP WORDLINE TRENCH TO SHIELD CROSS COUPLING BETWEEN ADJACENT CELLS FOR SCALED NAND

CROSS REFERENCE TO RELATED APPLICATIONS

This application is related to U.S. Pat. No. 5,867,429 entitled "High Density Non-Volatile Flash Memory Without Adverse Effects of Electric Field Coupling Between Adjacent Floating Gates" which is hereby incorporated by this reference in its entirety.

BACKGROUND OF THE INVENTION

1. Field of the Invention

This invention relates generally to flash electrically erasable and programmable read only memory (EEPROMS), and more specifically to NAND flash memory with a high memory cell density.

2. Related Art

Most existing commercial flash EEPROM products operate each memory cell with two ranges of threshold voltages, one above and the other below a breakpoint level, thereby defining two programmed states. One bit of data is thus stored in each cell, a 0 when programmed into one state and a 1 when programmed into its other state. A chunk of a given number of bits of data is programmed at one time into an equal number of cells. The state of each cell is monitored during programming so that application of programming voltages stops when the threshold level of an individual cell is verified to have moved within the range that represents the value of the bit of data being stored in the cell.

In order to increase the amount of data stored in a flash EEPROM system having a certain number of storage cells, the individual cells are operated with more than two threshold level states. Preferably, two or more bits of data are stored in each cell by operating the individual cells with four or more programmable states. Three threshold breakpoint levels are necessary to define four different threshold states. Such a system is described in U.S. Pat. Nos. 5,043,940 and 5,172,338, which are hereby incorporated by this reference in their entirety. In multi-state operation, an available operating voltage range of the individual cells is divided into an increased number of states. The use of eight or more states, resulting in storing three or more bits of data per cell, is contemplated. The voltage range of each state necessarily becomes smaller as the number of states is increased. This leaves less margin within each state to accommodate any error that might occur during operation of the memory system.

One type of error is termed a "disturb," wherein electrons are unintentionally added to or taken away from a floating gate during operation of the memory. One source of a disturb is the presence of a leaky oxide dielectric positioned between the floating gate and another conductive gate of a cell. The charge level programmed onto a floating gate of a cell changes when such a leaky oxide is present, thus leading to the possibility that the state of the cell will be incorrectly read if the change in charge has been large enough. Since few to no errors can be tolerated in a mass digital data storage system, a sufficient margin for this error is provided by making the voltage range allocated to each state sufficient to include an expanded range of voltages that can occur as the result of such disturbs. This necessarily limits the number of states that can be included in a multi-state flash EEPROM system since the total available voltage range is limited.

Another type of error is termed the "Yupin effect." The Yupin effect occurs when the neighboring cell of a selected cell is programmed after the selected cell itself is programmed, and the charges of the neighboring cell influence the voltage of the selected cell. Such interference from the subsequently programmed neighbor cell distorts the voltages of the selected cell, possibly leading to an erroneous identification of its memory state during reading.

SUMMARY OF THE INVENTION

The present invention is an improved structure for high density NAND type flash memory that minimizes the effect of disturbs and Yupin effect errors.

One aspect of the invention is a NAND flash memory device formed from a substrate. The device comprises strings of transistors. Each string has a first select gate, a plurality of floating gates, and a second select gate. The floating gates are formed between shallow trench isolation areas and wordlines extend across adjacent strings and extend between the floating gates into the shallow trench isolation areas thereby isolating adjacent floating gates.

A further aspect of the invention is a method of making a memory device in a substrate. The method comprises forming a first set of parallel trenches in the substrate, depositing an oxide layer within the first set of trenches, and forming a series of floating gates between the trenches of the first set of trenches. A second set of parallel trenches is formed in the oxide layer deposited within the first set of trenches. The method also comprises forming a wordline above adjacent floating gates, the wordline extending into the second set of trenches thereby isolating one of the floating gates from a charge applied at an adjacent floating gate.

Another is aspect of the invention involves floating gates for storing data located above a substrate, a means for isolating adjacent floating gates, and means for reading the data stored in the floating gates, the means for reading the data located above and interconnecting strings of floating gates, and extending between adjacent strings of floating gates thereby shielding adjacent floating gates.

The present invention is better understood upon consideration of the detailed description below, in conjunction with the accompanying drawings of illustrative embodiments of the invention.

DETAILED DESCRIPTION OF THE INVENTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings are not to be considered in a limiting sense, as it is understood that the present invention is in no way limited to the embodiments illustrated.

Figure 1A:
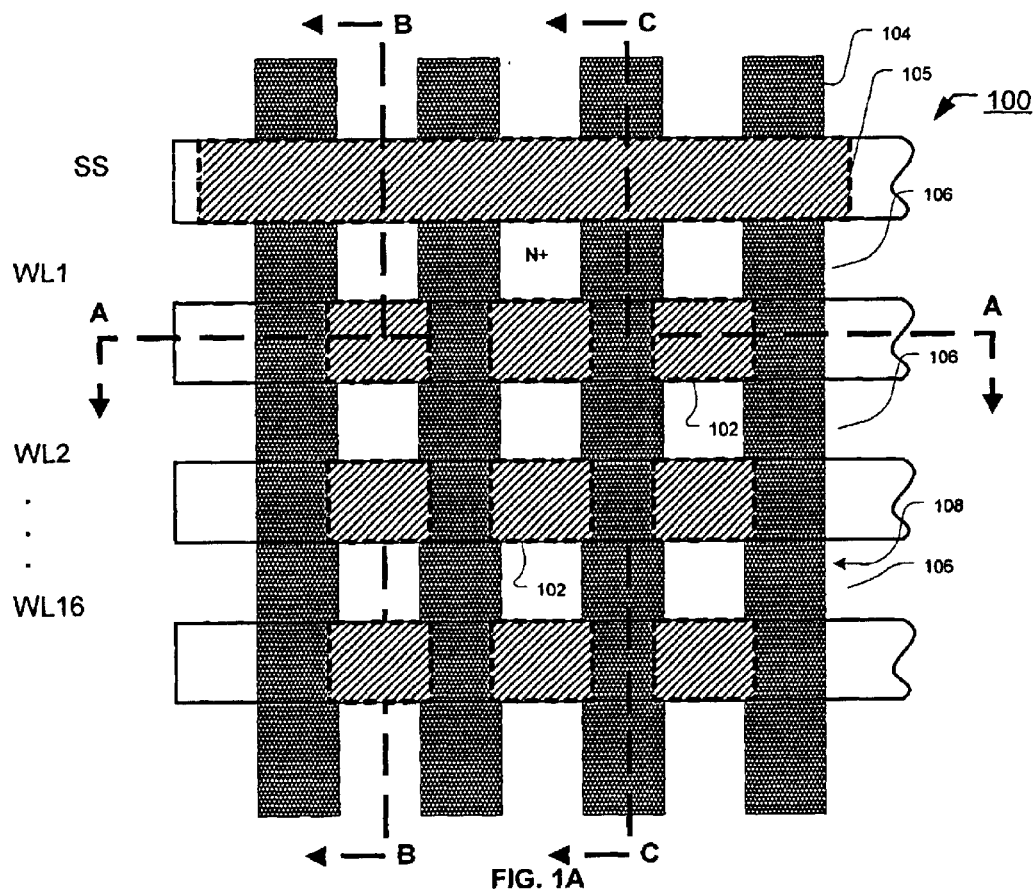
FIG. 1A is a plan view of the structure of memory array 100.
Figure 2:
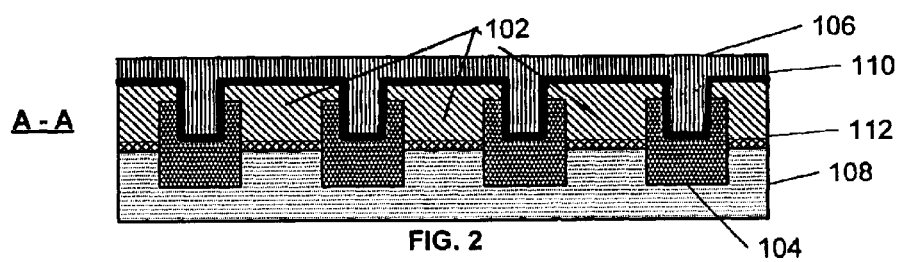
FIG. 2 is a cross section of memory array 100.
Figure 3:
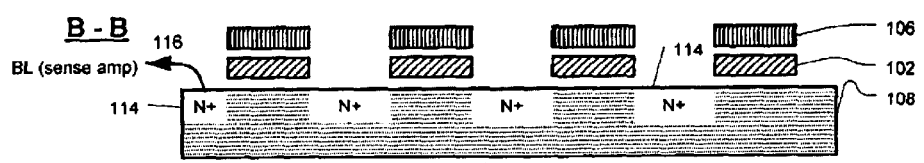
FIG. 3 is a cross section of memory array 100.
Figure 4:
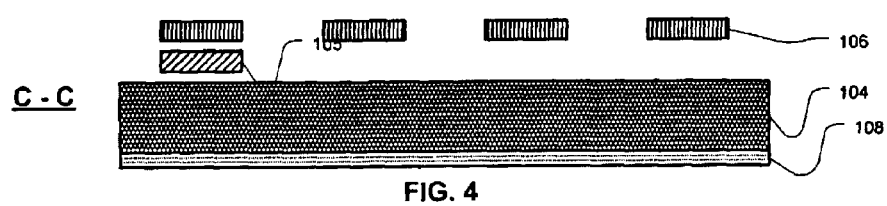
FIG. 4 is a cross section of memory array 100.
Figure 1B:
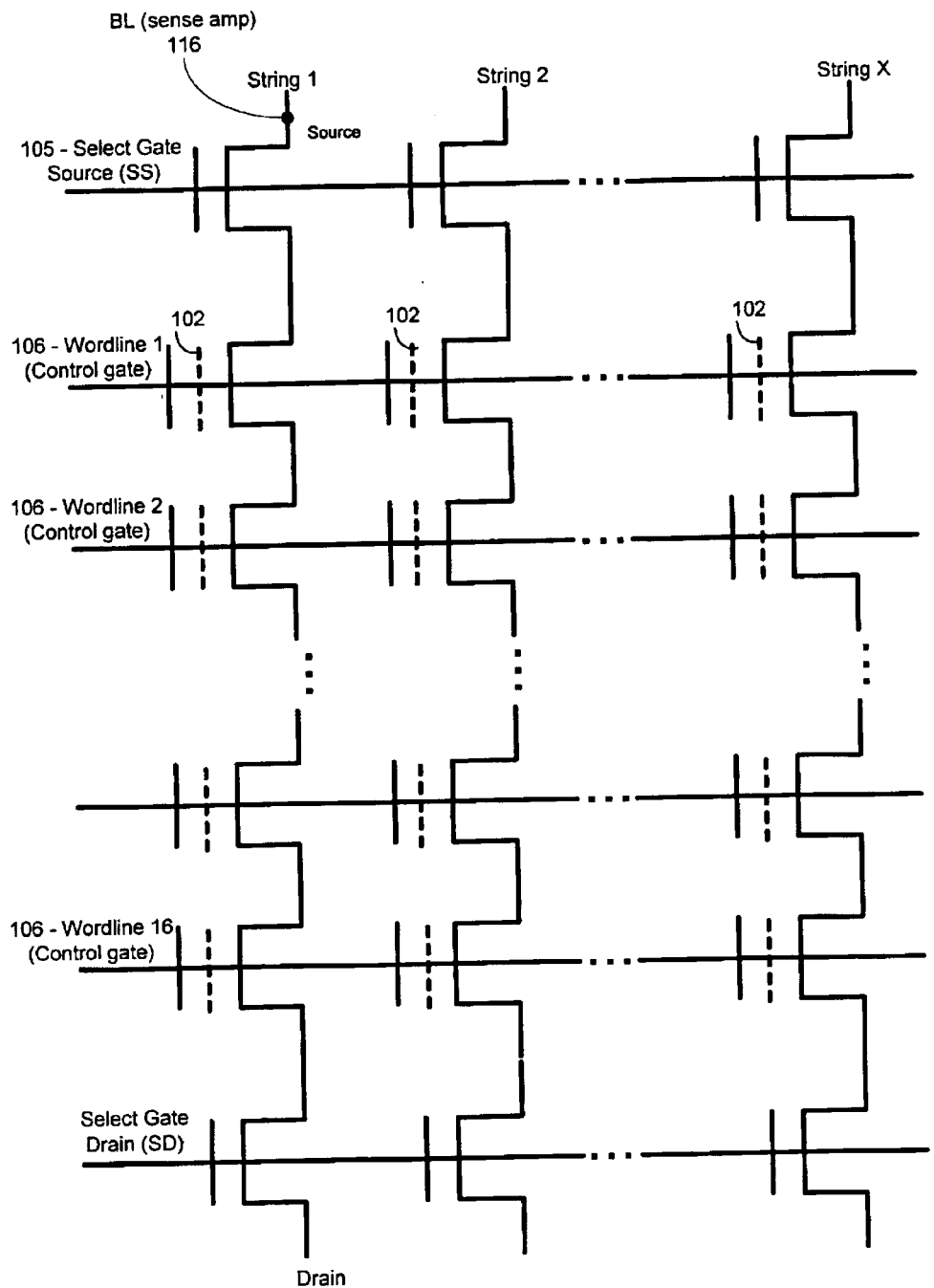
FIG. 1B is an electrical circuit diagram corresponding to the structure of FIG. 1.

FIG. 1A illustrates a plan view of an embodiment of the NAND flash memory of the present invention. FIGS. 2–4 are cross sections taken through the structure shown in FIG. 1A. An electrical equivalent circuit of the memory array is given in FIG. 1B, wherein common elements within the structure of FIGS. 1A and 2–4 are identified by the same reference character.

Parallel wordlines 106 connect adjacent NAND strings of floating gates 102. The wordlines 106 are illustrated horizontally, and the strings are illustrated vertically in the figures. A NAND string generally includes a select gate followed by several floating gates and another select gate. The circuit diagram of FIG. 1B most clearly shows the vertical array of strings. In this case sixteen floating gates and thus sixteen wordlines are illustrated per string, however, the number of floating gates may be thirty-two or more, and is foreseen to increase in the future. Floating gates 102 are isolated from adjacent floating gates by isolation trenches 104. Isolating trenches 104 are also referred to as shallow trench isolation areas. The select gate line 105 on the source side ("SS") is continuous between trenches 104, as can be seen in section C-C of FIG. 4. It is not etched into individual floating gates. At the end of the wordline 106 above SS 105, each NAND string is electrically connected to SS 105 with a via, most easily seen in FIG. 1B an FIG. 3.

Metal bitlines 116 (only one of which is shown for the sake of clarity) connect to the N+ regions 114 within substrate 108 to sense amplifiers for reading the charge stored in the floating gates 102. Thus, to read a particular floating gate a string is selected via the bitline and a wordline is also selected. The metal bitlines are generally, but not necessarily, formed in a conductive layer insulated from the wordlines. At the end of each string is another select gate coupled to the drain ("SD"). The drain and source can be interchanged in some configurations and more than 16 transistors can also be present in each string, thus also increasing the number of wordlines.

As seen in FIG. 2, there is a portion of gate oxide 112 between each floating gate 102 and the substrate 108. A dielectric material 110 separates the wordlines 106 from the floating gates 102 and the isolation trenches 104. Adjacent floating gates 102 are isolated from other floating gates in the same wordline, not only by isolating trenches 104, but also by wordlines 106. Wordlines 106 extend down between floating gates into isolation trenches 104, until, within, or past the level of gate oxide layer 112. This has three distinct benefits.

First, it reduces Yupin effects between adjacent cells in the wordline direction. Second, it improves the cell coupling ratio between the wordlines and the floating gates. The portion of the wordline that extends into the isolation trenches, to or past the depth of the floating gates, increases the overlap of the surface areas and volumes of the wordlines and floating gates. This increased overlap results in better coupling when a charge is read or stored during program, read, or erase operations.

Third, the electrical field across the dielectric layer 110 between adjacent floating gates is reduced, therefore reducing any leakage current through the dielectric layer that may occur as a result of the electrical field. The lesser the electrical field, the lesser the leakage current between two adjacent floating gates. Additionally, the leakage current path is greatly increased by the extended wordlines 106. Any leakage current must travel down and around the extended portion of the wordlines and then back up or over to the adjacent floating gates. The charge level programmed onto a floating gate of a cell changes when such a leakage current is present. Therefore, by minimizing the leakage current, and thus any change in charge of the floating gates, an increased number of levels can be discerned more reliably. This leads to a higher capacity, more cost efficient, and more reliable data storage system.

Figure 5:
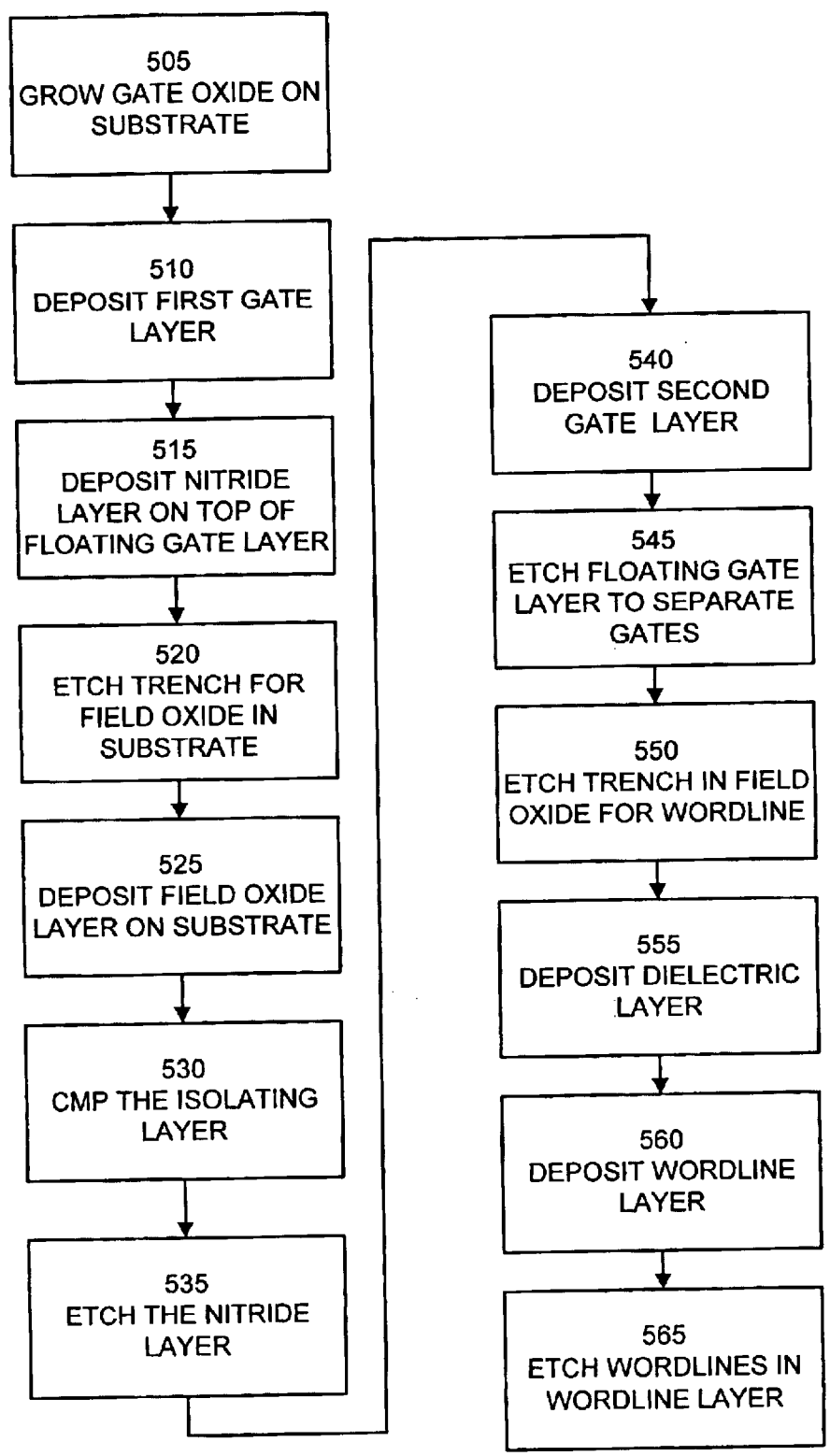
FIG. 5 is a flow chart of a method of forming an embodiment of the present invention.

FIG. 5 is a flowchart of the steps of making memory array 100 which should be referred to in tandem with FIGS. 6A–6L.

Figure 6A:
FIGS. 6A–6J are cross sections of memory array 100 at various stages during the fabrication process.
Figure 6B:
Figure 6C:
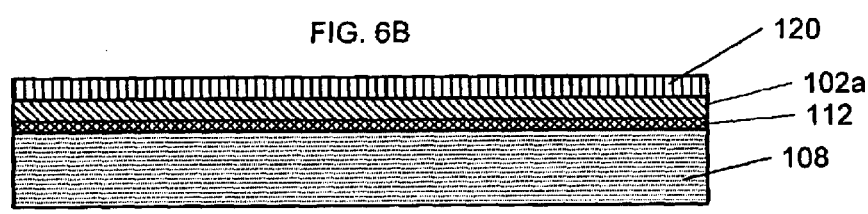
Figure 6D:
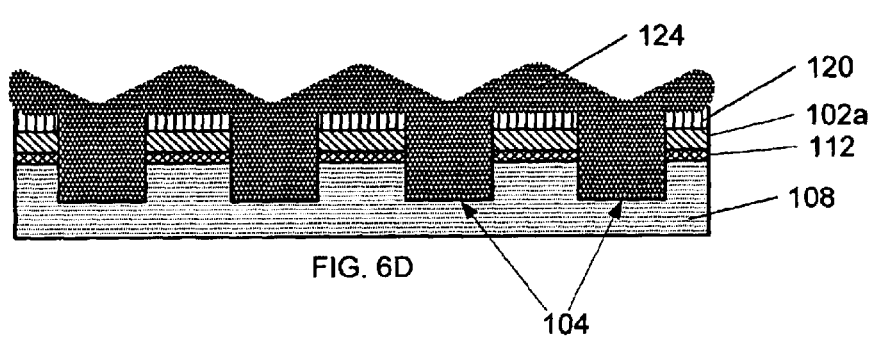
Figure 6E:
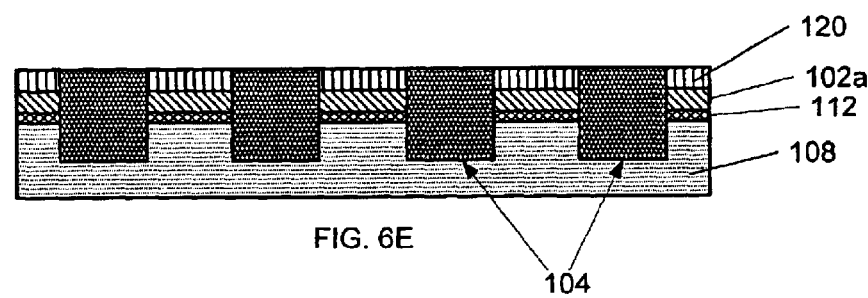

The memory array 100 is fabricated in a substrate 108. Substrate 108 preferably comprises silicon but may also comprise any material known to those in the art such as Gallium Arsenide etc . . . First, agate oxide layer 112 is formed upon substrate 108 instep 505 as seen in FIG. 6A. Gate oxide 112 is preferably grown on substrate 108 but may also be deposited. Gate oxide layer 112 preferably comprises silicon dioxide but may differ depending on what type of substrate is used and other processing factors or elements introduced during processing. For example, for CMOS applications, gate oxide 112 may comprise materials (known as ETO) including nitride/oxynitride. Next, a first gate layer 102a is deposited upon gate oxide layer 112 in step 510 as seen in FIG. 6B. The first gate layer 102a is made of semiconducting material such as polysilicon. A nitride layer 120 is then deposited upon the first floating gate layer 102a in step 515 as seen in FIG 6c. In step 520, parallel trenches are etched in substrate 108 with well known etching techniques. Generally in fabricating high density memory arrays where the features are of a very small scale, plasma etching is preferred over wet etching in order to have a precise and uniform etch. In step 525 the trenches are then filled with a field oxide, as seen in FIG. 6D, to form isolation trenches 104. The field oxide within isolation trenches 104 is preferably comprised of silicon dioxide but can be comprised of other insulating materials (including materials other than oxides). Isolation trenches 104 range from about 0.2 microns to about 0.25 microns wide and are preferably about 0.2 microns wide. The remaining field oxide 124 is removed via chemical-mechanical polishing ("CMP") in step 530, as seen in FIG. 6E.

Figure 6F:
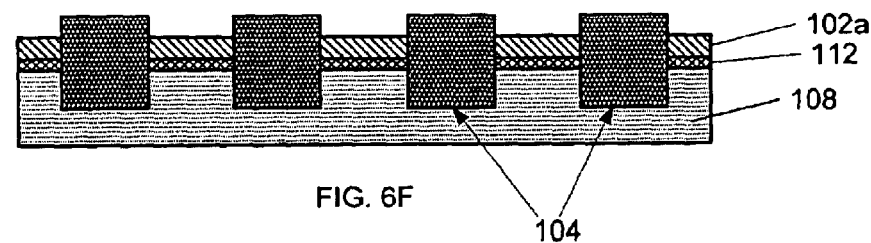
Figure 6G:
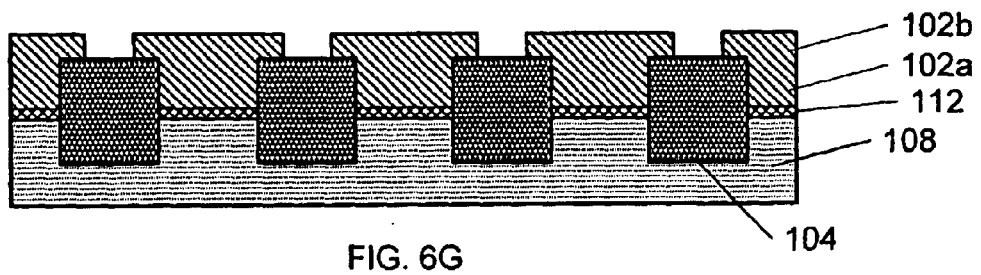

Next, in step 535, nitride layer 120 is etched away such that isolation trenches 104 extend above the surface of the first gate layer 102a, as seen in FIG 6F. The isolating trenches 104 may extend above the substrate 108 and gate oxide layer 112 as shown, or alternatively may only extend up to the level of either the substrate 108, gate oxide layer 112, or first gate layer 102a and it should be understood that differing processes and steps may be necessary to achieve these differing embodiments.

A second gate layer 102b of the same semiconducting material as the first gate layer 102a is then deposit upon the gate oxide layer 112 and isolation trenches 104 in step 540. It is then selectively etched above isolation trenches 104 to create floating gates 102 in step 545. The resultant structure can be seen in FIG. 6G. Floating gates 102 are substantially "T" shaped in order to maximize the coupling between the floating gate and the control gate, also referred to as the wordline 106 that activates the floating gate. The line between the first and second gate layers 102a and 102b has been removed for the sake of clarity. The T shape provides a large surface area between floating gate and the wordline, thus maximizing the coupling ratio between the two devices for improved read, program and erase operations. For further information, please refer to co-pending U.S. patent application Ser. No. 09/925,102, and U.S. Pat. No. 6,762,092, issued Jul. 13, 2004 to Yuan et at, entitled "Scalable Self-Aligned Dual Floating Gate Memory Cell Array and Methods of Forming the Array," which is hereby incorporated by this reference in its entirety.

Figure 6H:
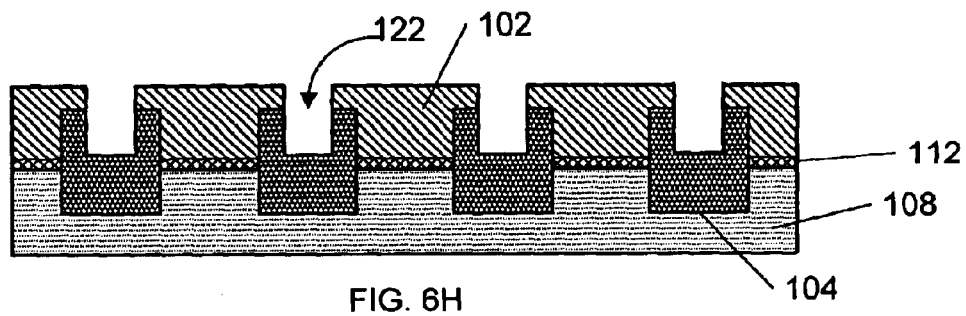
Figure 6I:
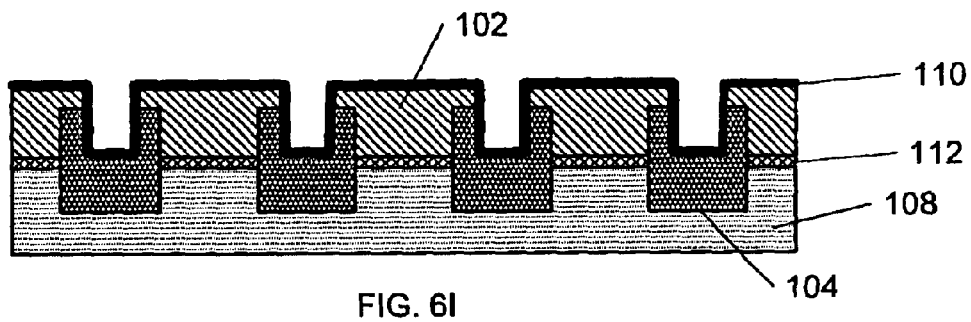
Figure 6J:
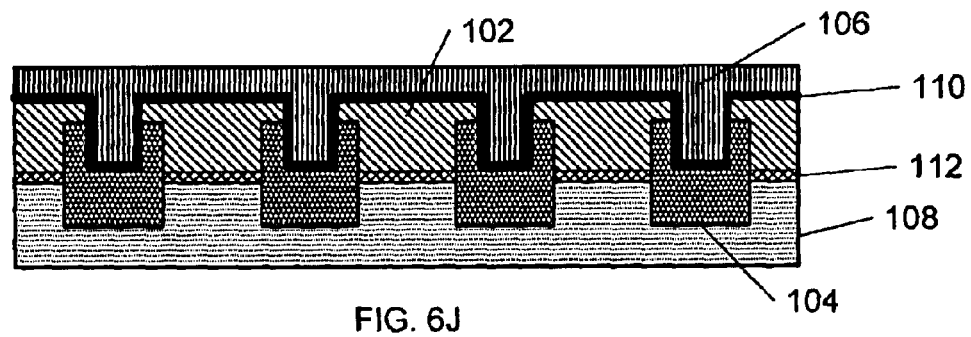

As seen in FIG. 6H, a set of parallel trenches 122 is formed within isolating trenches 104 in step 550. Trenches 122 may extend within trenches 104 to the level of the upper surface of gate oxide 112 or any distance within trenches 104 within or below the level of gate oxide 112. Isolation layer 110 is then deposited upon the floating gates 102, and within second trenches 122 in isolation trenches 104, in step 555, as seen FIG 6I. Isolation layer 110 is preferably a dielectric layer such as an oxide-nitride-oxide ("ONO") layer 110. The dielectric layer 110 can be any type of dielectric known in the art and is not necessarily limited to an ONO structure. A wordline layer comprising a semiconducting material layer such as polysilicon and a conductive layer such as tungsten silicide is then deposited upon dielectric layer 110 in step 560, as can be seen in FIG. 6J. Wordlines 106 are then etched from the wordline layer in step 565.

As previously mentioned, the wordlines 106 extend down between the floating gates 102 into the isolating trenches 104. This isolates adjacent floating gates 102 from each other. In the preferred embodiment, wordlines 106 extend within the isolation trenches 104 to or beyond the level of the gate dielectric 112.

The various layers can be formed and the etching steps can be performed in many different well known methods and orders, and are not necessarily done in the order described, i.e. gate oxide layer 112 may be formed before or after the parallel trenches are etched into substrate 108 etc. . . . Furthermore, additional layers, steps, and resultant structures that are not described may also be part of the process and the resultant memory array.

The extended wordline reduces the problem of the aforementioned Yupin effect because it acts as a shield between adjacent floating gates. Again, in short, the Yupin effect is when the charge stored on a neighboring cell influences the reading of a selected cell. The present solution shields gates to avoid or minimize Yupin effect errors caused by neighboring gates. Yupin effect errors can also be accommodated through program and read circuitry and algorithms that are described in co-pending U.S. patent application Ser. No. 10/254,483, attorney docket number M-12066 US, to Cernea, entitled "Highly compact non-volatile memory and method thereof" now publised U.S. Pat. Appl. No. 2004/0060031 which is hereby incorporated in its entirety by this reference.

The extended wordline also protects against conduction leakage between adjacent floating gates within the dielectric layer 110 because it blocks the conduction path between adjacent gates. Furthermore, any possible stringers as a result of an incomplete etch of the floating gate layer that might short circuit adjacent gates are also eliminated in the situation where the etch within the isolation trench extends past the upper (top of the "T") portion of the T shaped floating gate. For more information on the Yupin effect and on disturbs, please refer to U.S. Pat. No. 5,867,429, which was previously incorporated by reference.

While embodiments of the present invention have been shown and described, changes and modifications to these illustrative embodiments can be made without departing from the present invention in its broader aspects. Thus, it should be evident that there are other embodiments of this invention which, while not expressly described above, are within the scope of the present invention and therefore that the scope of the invention is not limited merely to the illustrative embodiments presented. Therefore, it will be understood that the appended claims set out the metes and bounds of the invention. However, as words are an imperfect way of describing the scope of the invention, it should also be understood that equivalent structures and methods while not within the express words of the claims are also within the true scope of the invention.

What is claimed is:

1. A flash memory device formed from a substrate, the device comprising:

strings of transistors of a NAND architecture comprising a first select gate, a plurality of floating gates, and a second select gate, wherein the floating gates are formed between shallow trench isolation areas;

wordlines extending across adjacent strings and extending between the floating gates into the shallow trench isolation areas thereby isolating adjacent floating gates; and a gate oxide layer between the floating gates and the substrate, the wordline extending down past the level of an upper surface of the gate oxide layer.

2. The flash memory device of claim 1 wherein the wordline isolates a floating gate of the plurality of floating gates from current leakage of an adjacent floating gate.

3. The flash memory device of claim 1 wherein the wordline isolates a floating gate of the plurality of floating gates from an electrical field of an adjacent floating gate, thereby minimizing field effect coupling between adjacent floating gates.

4. The flash memory device of claim 1 further comprising a gate oxide layer between the floating gates and the substrate, the wordline extending down to the level of an upper surface of the gate oxide layer.

5. The flash memory device of claim 1 wherein the shallow trench isolation areas comprise an oxide layer.

6. The flash memory device of claim 1 wherein the wordlines comprise polysilicon.

7. The flash memory device of claim 6 wherein the worldlines further comprise Tungsten Silicide.

8. The flash memory device of claim 1 further comprising an oxide-nitride-oxide layer between the floating gates and the wordlines.

9. The flash memory device of claim 1 wherein the floating gates are approximately T shaped thereby maximizing the coupling ratio between the wordlines and the floating gates.

10. The flash memory device of claim 9 wherein the floating gates extend above a portion of the shallow trench isolation areas.

11. A method of making a memory device in substrate comprising:

forming a first set of parallel trenches in the substrate;

depositing an oxide layer within the first set of trenches;

forming a series of floating gates between the trenches of the first set of trenches;

forming a second set of parallel trenches in the oxide layer deposited within the first set of trenches;

forming a wordline above adjacent floating gates, the wordline extending into the second set of trenches thereby isolating one of the floating gates from a charge applied at an adjacent floating gate.

12. The method of claim 11 wherein the oxide layer deposited within the first set of trenches extends above the substrate.

13. The method of claim 12 further comprising etching away the oxide layer between the first set of trenches.

14. The method of claim 11 wherein forming the floating gates comprises depositing a polysilicon layer and etching away the layer between the gates.

15. The method of claim 14 wherein the polysilicon layer is etched such that a portion of the floating gates extend above the oxide layer within the first set of trenches.

16. The method of claim 15 wherein the floating gates are approximately T shaped.

17. The method of claim 11 wherein the memory device formed is a NAND flash memory device.

18. A non-volatile memory device comprising:
  floating gates configured to store a charge;
  bitlines configured to select amongst the floating gates;
  wordlines configured to select amongst the plurality of floating gates, the wordlines extending between adjacent floating gates so as to shield a selected floating gate from an electrical field of adjacent floating gates,
  sense amplifiers configured to connect to the bitlines; and
  wherein the non-volatile storage device is NAND flash memory.

19. The non-volatile memory device of claim 18 further comprising isolating trenches between the floating gates, the wordlines extending into the isolating trenches.

20. The non-volatile memory device of claim 19 wherein the device further comprises a substrate and a gate oxide between the substrate and the floating gates, and wherein the wordlines extend to the gate oxide.

21. The non-volatile memory device of claim 19 wherein the isolating trenches comprise silicon dioxide.

22. The non-volatile memory device of claim 19 wherein the portion of the wordlines extending into the isolating trenches shields a selected floating gate from current leakage of adjacent floating gates.

23. The non-volatile memory device of claim 22 wherein the portion of the wordlines extending into the isolating trenches further shield a selected floating gate from electric field effects of adjacent floating gates.

24. A flash memory device comprising:
  floating gates for storing data located above a substrate;
  means for isolating adjacent floating gates; and
  means for reading the data stored in the floating gates, the means for reading the data located above the floating gates and interconnecting strings of floating gates, and extending between adjacent strings of floating gates into the means for isolating floating gates thereby shielding adjacent floating gates.

25. The flash memory device of claim 24 wherein the means for reading the floating gates extends within the means within the substrate for isolating adjacent floating gates.

26. The flash memory device of claim 25 wherein the means for reading shields adjacent floating gates from Yupin effect errors and from disturbs.

27. A method of forming a NAND flash memory array on a substrate, comprising:
  forming a plurality of alternating dietectric structures and first floating gate strips across a surface of the substrate;
  forming a plurality of second floating gate strips, a second floating gate strip partially overlying a frist floating gate strip and partially overlying adjacent dielectric structures;
  forming trenches in the plurality of dielectric structures, an individual trench extending from an upper surface of a dielectric structure between adjacent second floating gate strips; and
  forming worldines extending across the plurality of second floating gate strips, wordlines extending between adjacent second floating gate strips and extending into the trenches in the dielectric structures.

28. The method of claim 27 wherein the second floating gate strips are formed by depositing a blanket layer of floating gate material and removing portions of the floating gate material that overlie dielectric structures.

29. The method of claim 27 wherein removing a portion of the floating gate material that overlies a dielectric structure exposes the upper surface of the dielectric structure between adjacent second floating gate strips.

30. The method of claim 27 wherein the trenches are self-aligned to the second floating gate strips.

31. The method of claim 27 further comprising forming a dielectric layer or layers between a second floating gate strip and a wordline.

32. The method of claim 27 wherein the trenches extend to the level of the surface of the substrate.

* * * * *